(12) United States Patent
Yang et al.

(10) Patent No.: US 7,741,659 B2
(45) Date of Patent: Jun. 22, 2010

(54) SEMICONDUCTOR DEVICE

(75) Inventors: Ching-Ho Yang, Hsinchu (TW);
Jung-Ching Chen, Hsinchu (TW);
Shyan-Yhu Wang, Hsinchu County
(TW); Shang-Chi Wu, Hsinchu (TW)

(73) Assignee: United Microelectronics Corp.,
Hsinchu (TW)

( * ) Notice: Subject to any disclaimer, the term of this patent is extended or adjusted under 35 U.S.C. 154(b) by 31 days.

(21) Appl. No.: 11/924,079

(22) Filed: Oct. 25, 2007

(65) Prior Publication Data

US 2009/0108348 A1    Apr. 30, 2009

(51) Int. Cl.
*H01L 27/10* (2006.01)
(52) U.S. Cl. .................. 257/203; 257/202; 257/204; 257/206; 257/339; 257/341; 257/376; 257/401; 257/409; 257/487
(58) Field of Classification Search .......... 257/202, 257/203, 204, 206, 339, 341, 376, 401, 409, 257/487
See application file for complete search history.

(56) References Cited

U.S. PATENT DOCUMENTS

| | | | |
|---|---|---|---|
| 4,969,169 A | 11/1990 | Forsyth | |
| 5,310,607 A | 5/1994 | Schulz et al. | |
| 5,447,804 A | 9/1995 | Schulz et al. | |
| 6,495,129 B1 | 12/2002 | Li et al. | |
| 6,514,830 B1 | 2/2003 | Fang et al. | |
| 6,643,591 B1 | 11/2003 | Korzekwa et al. | |
| 6,693,376 B1 | 2/2004 | Ito et al. | |
| 6,770,444 B2 | 8/2004 | Adham et al. | |
| 6,879,096 B1 | 4/2005 | Miyazaki et al. | |
| 6,972,115 B1 | 12/2005 | Ballard | |
| 7,096,137 B2 | 8/2006 | Shipton et al. | |
| 7,121,639 B2 | 10/2006 | Plunkett | |
| 7,152,942 B2 | 12/2006 | Walmsley et al. | |
| 7,157,850 B2 | 1/2007 | Miyazaki et al. | |
| 7,165,824 B2 | 1/2007 | Walmsley et al. | |
| 7,244,975 B2 * | 7/2007 | Chen et al. ............... 257/203 |

* cited by examiner

*Primary Examiner*—Long Pham
(74) *Attorney, Agent, or Firm*—Chun-Ming Shih

(57) ABSTRACT

A semiconductor device is provided. An isolation structure is formed in a substrate to define a first and a second active region, and a channel active region therebetween. A field implant region is formed below a portion of the isolation structure around the first, second, and channel active regions. A channel active region includes two first sides defining a channel width. The distance from each first side to a second side of a neighboring field implant region is d1. The shortest distance from a third side of each first or second active region to an extension line of each second side of the field implant region is d2. $R=d1/d2$, where $0.15 \leq R \leq 0.85$. A gate structure covers the channel active region and extends over a portion of the isolation structure. Source/drain doped regions are formed in the first and the second active regions.

16 Claims, 5 Drawing Sheets

SEMICONDUCTOR DEVICE

BACKGROUND OF THE INVENTION

1. Field of the Invention

The present invention relates to an integrated circuit, and more particularly to a semiconductor device.

2. Description of Related Art

MOS devices are widely used semiconductor devices. As the sizes of devices are gradually reduced, channel lengths are reduced, which accelerates the operation speed of MOS transistors, and meanwhile aggravates a short channel effect. Based on a formula of Electric field=Voltage/Length, if an applied voltage remains unchanged, and the channel length of a transistor is reduced, the energy of electrons in the channel will be increased under the acceleration of the electric field, thus resulting in more frequent electrical breakdown phenomena. The increase of intensity of the electric field may enhance the energy of electrons in the channel, which also results in the electrical breakdown.

Generally speaking, the breakdown voltage of a high voltage device happens earlier since the potential crowding phenomenon happens earlier on a surface of a side close to the drain region, such that it is difficult to raise the breakdown voltage. The conventional high voltage device increases the distance between a source/drain region and a gate region so as to reduce a transverse electric field in the channel by the use of an isolation structure. Moreover, the field implant region formed below the isolation structure may achieve a channel stop function, thereby improving the effect of breakdown voltage of the device.

FIG. 1 is a schematic cross-sectional view of a MOS device. Referring to FIG. 1, in order to raise the breakdown voltage of the device, a field implant region 112 is usually formed below the isolation structure 102. However, since the formed field implant region 112 usually not only is located below the isolation structure 102, but also extends upwards to be neighboring to the channel region 104. When the MOS device is applied in a high voltage, the voltage difference between the substrate 100 and the gate 124 is large. When a certain voltage difference is reached, the channel region 104 is inversed. The formed inversion layer and the field implant region 112 may form a PN junction, thus causing a severe leakage current.

SUMMARY OF THE INVENTION

The present invention is directed to provide a semiconductor device having a high enough breakdown voltage and a low leakage current.

The present invention provides a semiconductor device, which includes an isolation structure, a field implant region, a gate structure, and source/drain doped regions. The isolation structure is formed in a substrate to define a first active region, a second active region, and a channel active region therebetween, and those active regions are separated by the isolation structure. The field implant region is formed below a portion of the isolation structure around the first, the second, and the channel active regions. The channel active region includes two first sides defining a channel width. The distance from each first side to a second side of a neighboring field implant region is d1. The shortest distance from a third side of each first active region or each second active region to an extension line of each second side of the field implant region is d2. R=d1/d2, where $0.15 \leq R \leq 0.85$. The gate structure covers the channel active region and extends over a portion of the isolation structure. Source/drain doped regions are formed in the first and the second active regions, respectively.

In the semiconductor device according to an embodiment of the present invention, $0.26 \leq R \leq 0.52$.

In the semiconductor device according to an embodiment of the present invention, a conductivity type of dopant implanted into the field implant region is different from those of the source/drain doped regions.

In the semiconductor device according to an embodiment of the present invention, the semiconductor device includes a PMOS device.

In the semiconductor device according to an embodiment of the present invention, the PMOS device includes a P-type high-voltage device.

In the semiconductor device according to an embodiment of the present invention, the dopant implanted into the field implant region is N-type dopant.

In the semiconductor device according to an embodiment of the present invention, the semiconductor device includes an NMOS device.

In the semiconductor device according to an embodiment of the present invention, the NMOS device includes an N-type high-voltage device.

In the semiconductor device according to an embodiment of the present invention, the dopant implanted into the field implant region is P-type dopant.

In the semiconductor device according to an embodiment of the present invention, the field implant region is formed below a portion of the isolation structure around the first, the second, and the channel active regions.

In the semiconductor device according to an embodiment of the present invention, the isolation structure formed in the field implant region includes a first, a second, and a third isolation structures. The first isolation structure surrounds the first active region. The second isolation structure surrounds the second active region. The third isolation structure is formed around the first sides of the channel active region.

In the semiconductor device according to an embodiment of the present invention, the first and the second isolation structures protrude from the channel active region.

In the semiconductor device according to an embodiment of the present invention, the first and the second isolation structures have substantially the same boundary of the channel active region.

In the semiconductor device according to an embodiment of the present invention, the channel active region protrudes from the first and the second isolation structures.

In the semiconductor device according to an embodiment of the present invention, the third isolation structure encapsulates sides of the portion of the channel active region protruding from the first and the second isolation structures.

In the semiconductor device according to an embodiment of the present invention, the isolation structure includes a shallow-trench isolation structure.

In the semiconductor device according to an embodiment of the present invention, the isolation structure includes a field oxide layer.

The semiconductor device of the present invention has a high enough breakdown voltage and a low leakage current.

In order to make the aforementioned and other objectives, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
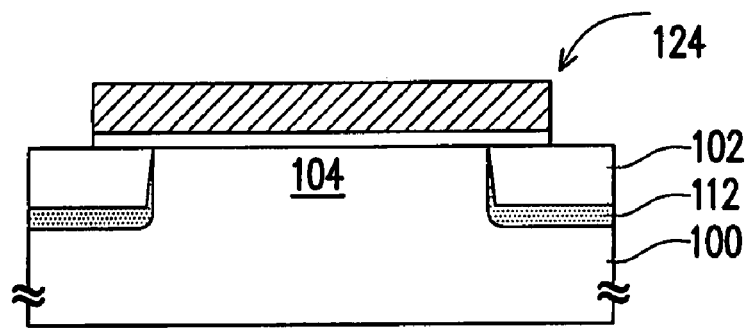
FIG. 1 is a schematic cross-sectional view of a MOS device.
Figure 2A:
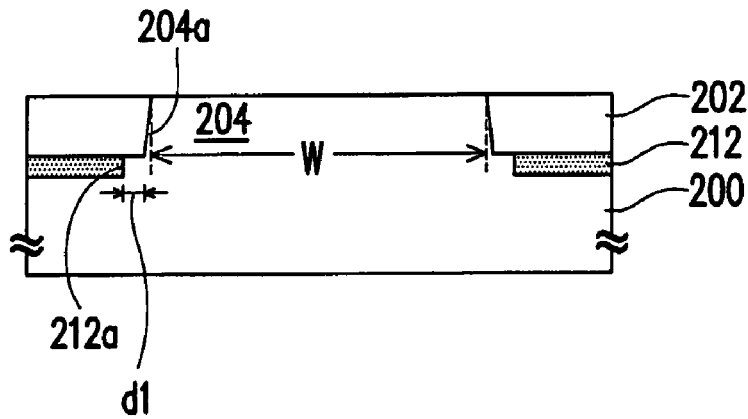
FIGS. 2A and 2B are schematic cross-sectional views illustrating processes of a manufacturing method of a semiconductor device according to an embodiment of the present invention.
Figure 2B:
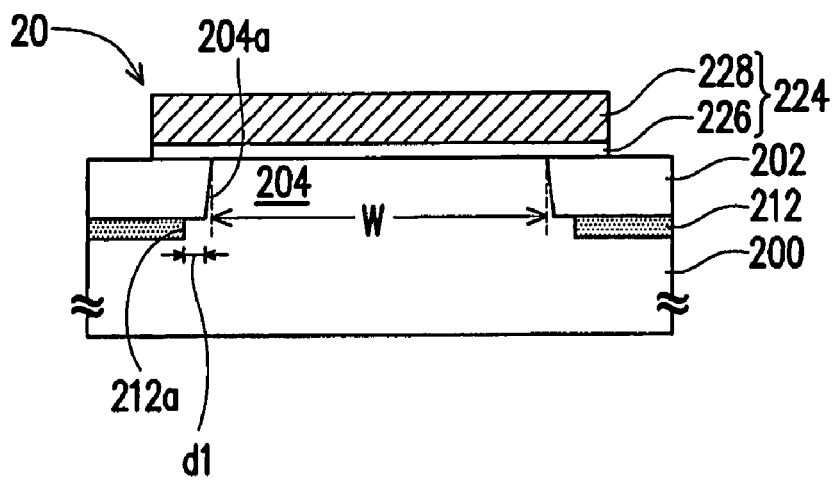
Figure 3A:
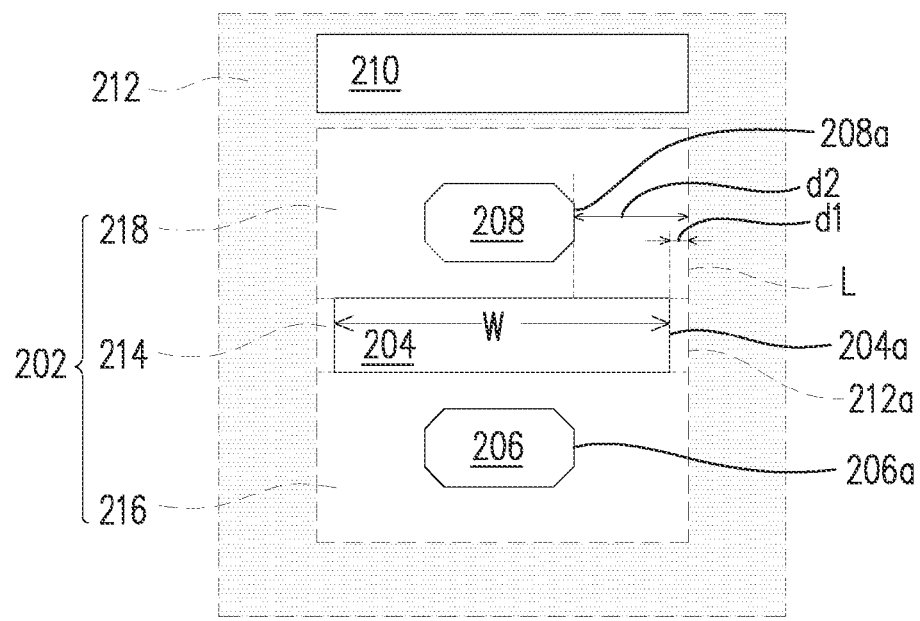
FIGS. 3A and 3B are top views illustrating processes of a manufacturing method of a semiconductor device according to an embodiment of the present invention.
Figure 3B:
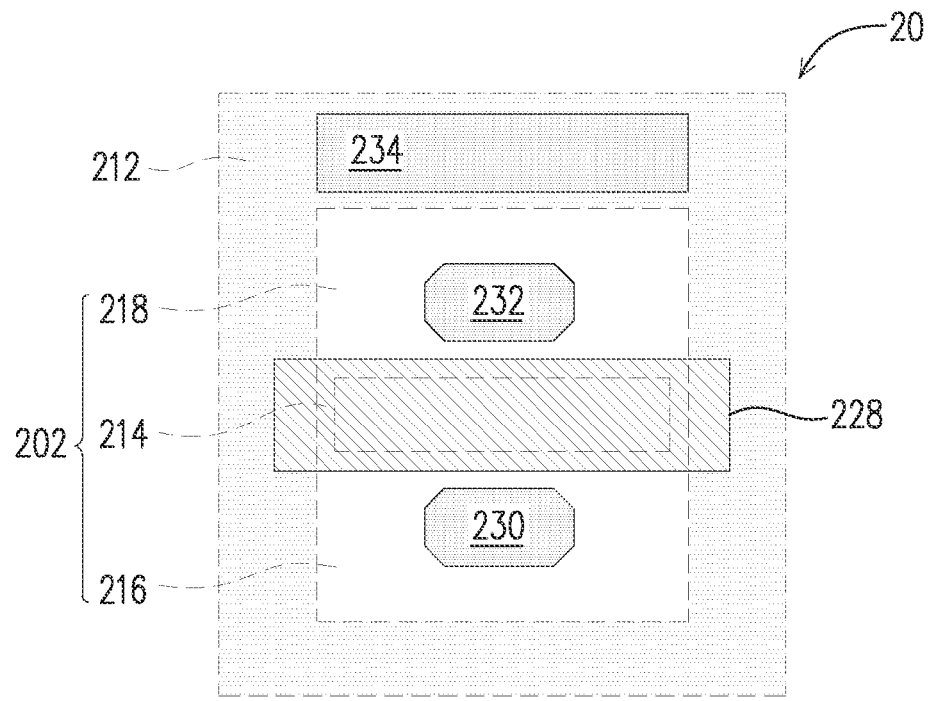
Figure 4A:
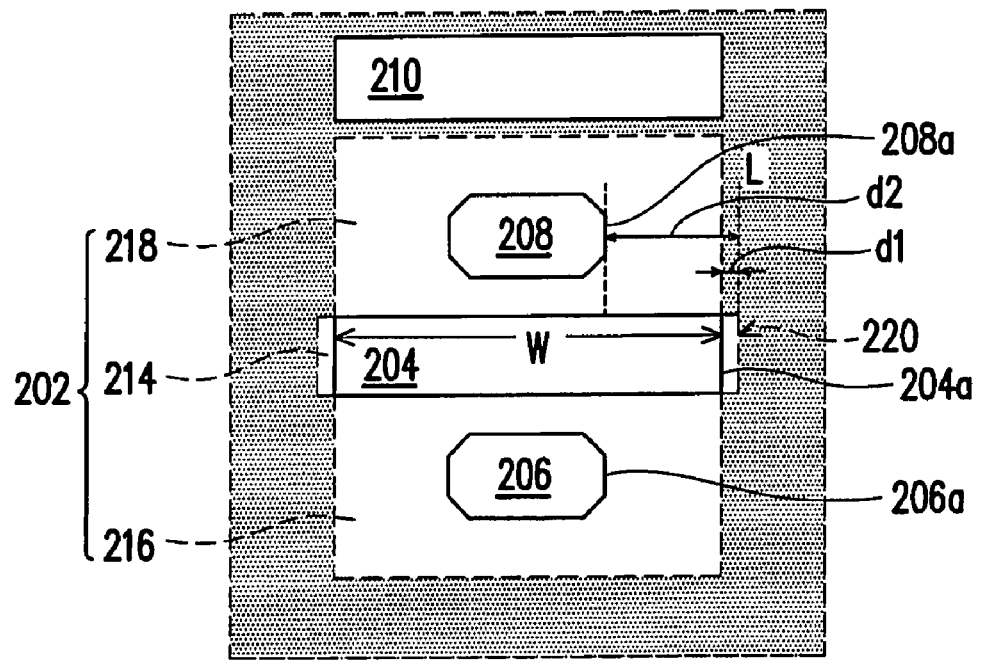
FIGS. 4A and 4B are top views illustrating processes of a manufacturing method of a semiconductor device according to another embodiment of the present invention.
Figure 4B:
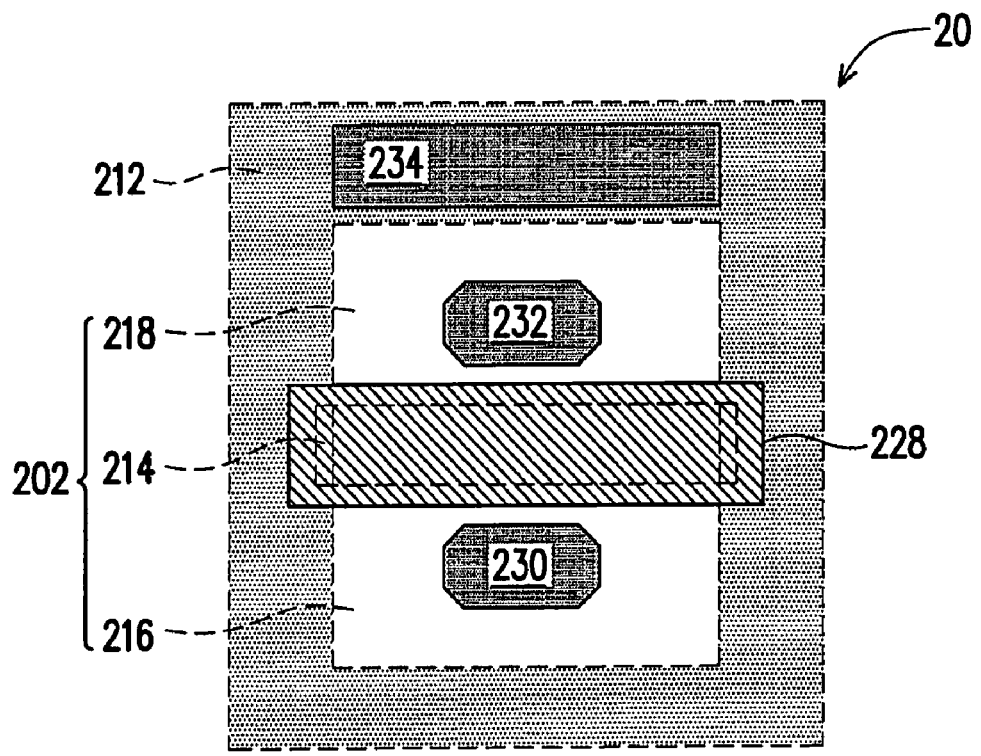
Figure 5A:
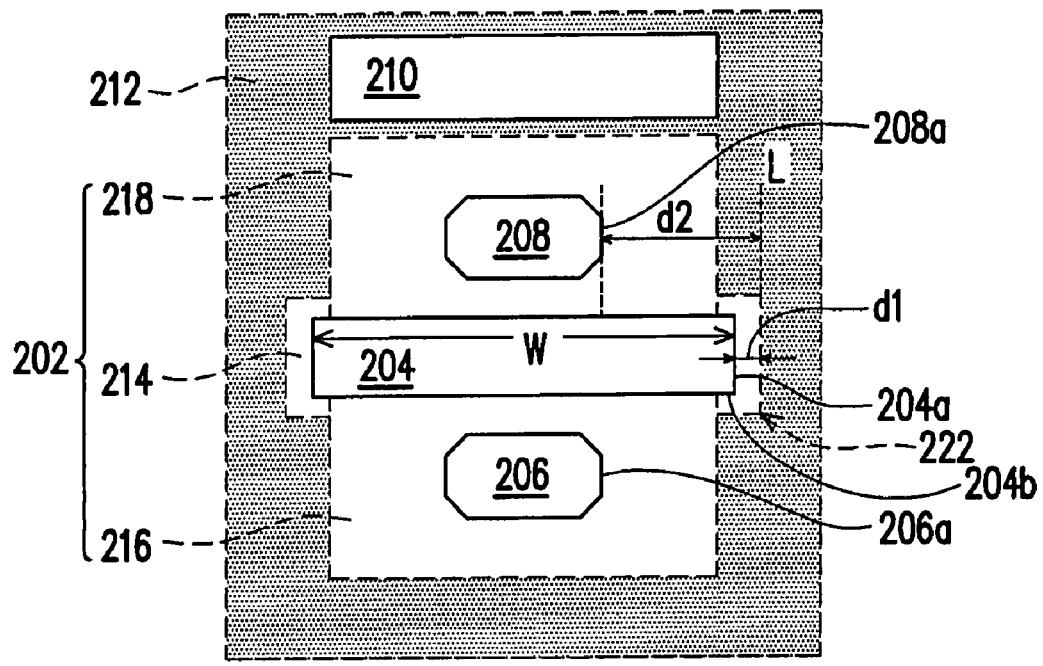
FIGS. 5A and 5B are top views illustrating processes of a manufacturing method of a semiconductor device according to still another embodiment of the present invention.
Figure 5B:
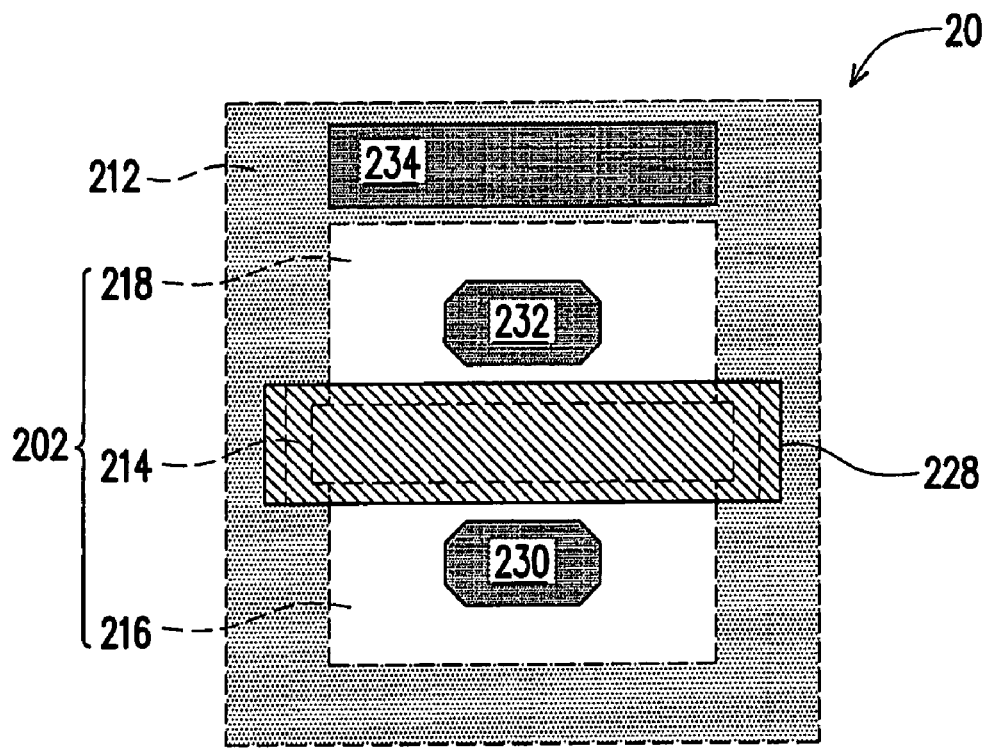

FIGS. 2A and 2B schematic cross-sectional views illustrating processes of a manufacturing method of a semiconductor device according to an embodiment of the present invention. FIGS. 3A and 3B are top views illustrating processes of a manufacturing method of a semiconductor device according to an embodiment of the present invention. FIGS. 4A and 4B are top views illustrating processes of a manufacturing method of a semiconductor device according to another embodiment of the present invention. FIGS. 5A and 5B are top views illustrating processes of a manufacturing method of a semiconductor device according to still another embodiment of the present invention.

Referring to FIGS. 2A and 3A, the manufacturing method of the semiconductor device of the present invention includes the following steps. An isolation structure 202 is formed in the substrate 200 and a field implant region 212 is formed below a portion of the isolation structure 202. The substrate 200 is, for example, a semiconductor substrate such as a silicon substrate, a semiconductor compound substrate, or a silicon-on-insulator (SOI) substrate. The isolation structure 202 defines a channel active region 204, active regions 206 and 208 located at two sides thereof, and an active region 210. The active regions 204, 206, 208, 210 are separated by the isolation structure 202. The isolation structure 202 may be a shallow-trench isolation structure formed by a shallow-trench isolation process, or a field oxide layer formed by a local oxidation process.

Figure 6:
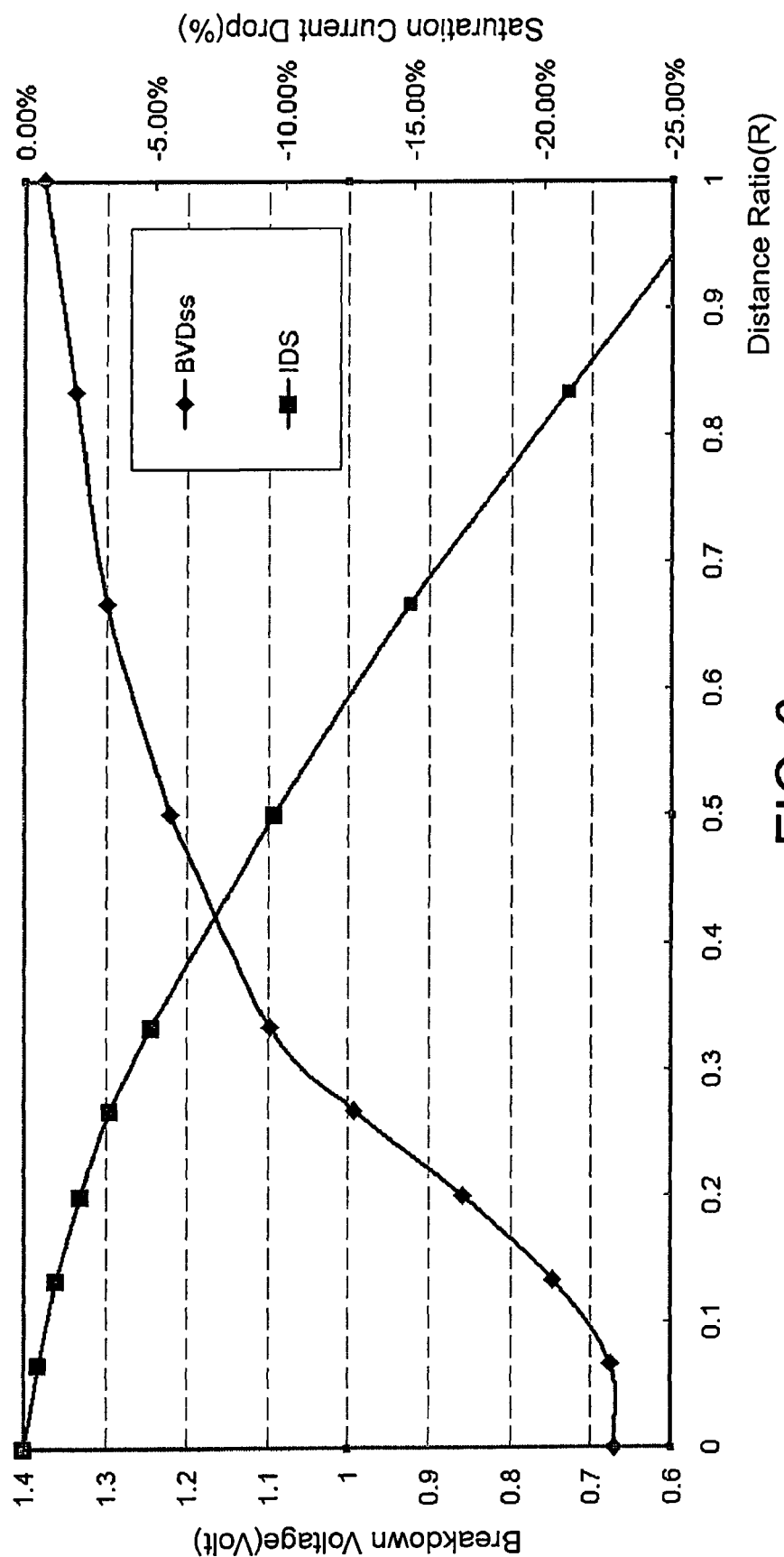
FIG. 6 is a drawing illustrating the relation between distance ratio R and the breakdown voltage (BVDss) and the relation the distance ratio R and saturation current (IDS) drop (%) of PMOS according to an embodiment of the present invention.

The field implant region 212 surrounds the channel active region 204, the active regions 206 and 208, and surrounds the active region 210. The field implant region 212 around the channel active region 204 and the field implant region 212 around the active regions 206 and 208 do not extend to the channel active region 204 and the active regions 206 and 208, and below the isolation structure 202 around the active regions 204, 206 and 208, and have a distance. More particularly, the channel active region 204 has two first sides 204a defining a channel width W. The distance from each first side 204a to each of second sides 212a of the neighboring field implant region 212 is d1, and the shortest distance from the sides 206a and 208a of the active regions 206 and 208 to an extension line L of each of the second sides 212a of the field implant region 212 is d2. The range of the distance d1 may be changed as required. R is a distance ratio of the distance d1 divided by the shortest distance d2. FIG. 6 is a drawing illustrating the relation between distance ratio R and the breakdown voltage (BVDss) and the relation the distance ratio R and saturation current drop (%) of PMOS according to an embodiment of the present invention. When R is less than 0.15, the distance d1 between the channel active region and a field implant region is too short, and the breakdown voltage will be too low. When R is greater than 0.85, the distance d1 between the channel active region and a field implant region is too long, and the channel width W will be too narrow. Thus, a saturation current is excessively low, thus influencing operation characteristics of the device. In an embodiment, R=d1/d2, where $0.15 \leq R \leq 0.85$. In another embodiment, R=d1/d2, where $0.26 \leq R \leq 0.52$.

In order to achieve $0.15 \leq R \leq 0.85$, the shapes and position relationships of the isolation structure 202 and the field implant region 212 may have different possible variations, and hereinafter three embodiments are given for illustration.

FIGS. 3A and 3B are top views illustrating processes of a manufacturing method of a semiconductor device according to an embodiment of the present invention. FIGS. 4A and 4B are top views illustrating processes of a manufacturing method of a semiconductor device according to another embodiment of the present invention. FIGS. 5A and 5B are top views illustrating processes of a manufacturing method of a semiconductor device according to still another embodiment of the present invention.

Referring to FIG. 3A, in an embodiment, the distance d1 is maintained through reducing the width W of the channel active region 204. In detail, the isolation structure 202 in the field implant region 212 includes isolation structures 214, 216, 218. The isolation structures 216 and 218 surround the active regions 206 and 208 respectively and protrude from the channel active region 204. The isolation structure 214 is formed around the sides 204a of the channel active region 204 and between the isolation structures 216 and 218.

Referring to FIG. 4A, in another embodiment, the width W of the channel active region 204 is substantially maintained unchanged, and the channel active region 204 has substantially the same boundary of the isolation structure 202 around the active regions 206 and 208. The distance d1 is maintained through forming two concavity 220 in the field implant region 212 corresponding to the sides 204a of the channel active region 204. In detail, the isolation structure 202 in the field implant region 212 includes isolation structures 214, 216, and 218. The isolation structures 216 and 218 surround the active regions 206 and 208 respectively, and have substantially the same boundary of the channel active region 204. The isolation structure 214 around the sides 204a of the channel active region 204 protrudes from the isolation structures 216 and 218, and is located in the concavities 220 of the field implant region 212.

Referring to FIG. 5A, in another embodiment, the width W of the channel active region 204 is larger, and the channel active region 204 protrudes from the boundary of the isolation structure 202 around the active regions 206 and 208. The distance d1 is maintained through forming a concavity 222 in the field implant region 212 corresponding to the sides 204a and 204b of the channel active region 204. In detail, the isolation structure 202 in the field implant region 212 includes isolation structures 214, 216, 218. The isolation structures 216 and 218 surround the active regions 206 and 208 respectively, but the channel active region 204 protrudes from the isolation structures 216 and 218. The isolation structure 214 is formed out of the isolation structures 216 and 218, encapsulates a portion of the sides 204a and 204b of the channel active region 204 protruding from the isolation structures 216 and 218, and is located in the concavities 222.

The dopant implanted into the field implant region 212 is P-type or N-type dopant. The N-type dopant is, for example, P or As. The P-type dopant is, for example, B. A conductivity type of the dopant implanted into the field implant region 212 is different from those of the subsequently formed doped regions 230 and 232. When the formed device is an NMOS device, the dopant implanted into the field implant region 212 is P-type dopant. When the formed device is a PMOS device, the dopant implanted into the field implant region 212 is N-type dopant. The field implant region 212 may be formed by an ion implantation process. When the isolation structure 202 is formed through a shallow-trench isolation process, the field implant region 212 may be formed after the shallow trench is formed and before the isolation layer is filled in the shallow trench. A mask layer is first formed on the substrate 200. Then, the field implant region 212 is formed through the ion implantation process. After that, the mask layer is removed. When the isolation structure 202 is formed through a local oxidation process, the field implant region 212 is formed through forming a mask layer, performing the ion implantation process, removing the mask layer, and then performing the local oxidation process.

After that, referring to FIGS. 2B, 3B, 4B, and 5B, a gate structure 224 is formed on the substrate 200. The gate structure 224 covers the channel active region 204 and extends over the isolation structure 202 around the channel active region 204. The gate structure 224 includes a patterned gate dielectric layer 226 and a patterned gate conductive layer 228. The material of the gate dielectric layer 226 includes silicon oxide, silicon nitride, silicon oxynitride, or a high-k material. The forming method is, for example, a thermal oxidation process or a chemical vapor deposition process. The material of the gate conductive layer 228 includes a silicon-based material, such as doped silicon, undoped silicon, doped polysilicon, or undoped polysilicon. When the material of the gate conductive layer is doped silicon or doped polysilicon, the silicon or the polysilicon may be N-doped or P-doped. In an embodiment, the gate conductive layer is constituted by a doped polysilicon layer and a salicide layer. The material of the salicide layer is, for example, a refractory metal silicide, and the refractory metal is one selected from the group consisting of Ni, Co, Ti, Cu, Mo, Ta, W, Er, Zr, Pt, and an alloy thereof. The gate structure 224 is formed by, for example, forming a gate dielectric material layer and a gate conductive material layer on the substrate 200, and performing a photolithography and etching process to pattern, so as to form the patterned gate dielectric layer 226 and the patterned gate conductive layer 228.

After that, doped regions 230, 232, and 234 are formed in the active regions 206, 208, and 210, and thus the fabricating of the semiconductor device 20 is completed. The doped regions 230, 232, and 234 may be formed by implanting the dopant into the active regions 206, 208, and 210 through the ion implantation process. When the formed semiconductor device 20 is an MOS device, the doped regions 230 and 232 may serve as source/drain regions, and the doped region 234 may serve as a pick up region. When the semiconductor device 20 is an NMOS device such as an N-type high-voltage device, the dopant in the doped regions 230 and 232 is N-type dopant. The N-type dopant is, for example, P or As. When the semiconductor device 20 is a PMOS device such as a P-type high-voltage device, the dopant in the doped regions 230 and 232 is P-type dopant. The P-type dopant is, for example, B.

In the above embodiments of the present invention, the field implant region is not formed below the isolation structure around the channel active region, but a scale of distance is maintained. Based on the rule $0.15 \leq R \leq 0.85$ of the present invention, the PN junction is not formed in the channel region since $0.15 \leq R$. Thus, the breakdown voltage is increased, and the leakage current is reduced. On the other hand, since $R \leq 0.85$, an appropriate saturation current may be controlled.

In the above embodiments of the present invention, the channel width of the channel active region and/or the position of the field implant region may be changed to maintain the distance below the isolation structure around the channel active region, thus the application is more flexible.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims and their equivalents.

What is claimed is:

1. A semiconductor device, comprising:
an isolation structure, formed in a substrate to define a first active region, a second active region, and a channel active region therebetween, which are separated by the isolation structure;
a field implant region, formed below a portion of the isolation structure around the first, the second, and the channel active regions, wherein the channel active region includes two first sides defining a channel width, a distance from each first side to a second side of a neighboring field implant region is d1, and a shortest distance from a third side of each first active region or each second active region to an extension line of each second side of the field implant region is d2, R=d1/d2, where $0.15 \leq R \leq 0.85$;
a gate structure, covering the channel active region and extending over a portion of the isolation structure; and
source/drain doped regions, formed in the first active region and the second active region, respectively.

2. The semiconductor device as claimed in claim 1, wherein $0.26 \leq R \leq 0.52$.

3. The semiconductor device as claimed in claim 1, wherein a conductivity type of dopant implanted into the field implant region is different from those of the source/drain doped regions.

4. The semiconductor device as claimed in claim 1, wherein the semiconductor device comprises a PMOS device.

5. The semiconductor device as claimed in claim 4, wherein the PMOS device comprises a P-type high-voltage device.

6. The semiconductor device as claimed in claim 4, wherein the dopant implanted into the field implant region is N-type dopant.

7. The semiconductor device as claimed in claim 1, wherein the semiconductor device comprises an NMOS device.

8. The semiconductor device as claimed in claim 7, the NMOS device comprises an N-type high-voltage device.

9. The semiconductor device as claimed in claim 7, wherein the dopant implanted into the field implant region is P-type dopant.

10. The semiconductor device as claimed in claim 1, wherein the isolation structure formed in the field implant region comprises:
- a first isolation structure, surrounding the first active region;
- a second isolation structure, surrounding the second active region; and
- a third isolation structure, disposed around the first sides of the channel active region.

11. The semiconductor device as claimed in claim 10, wherein the first and the second isolation structures protrude from the channel active region.

12. The semiconductor device as claimed in claim 1, wherein the isolation structure comprises a shallow-trench isolation structure.

13. The semiconductor device as claimed in claim 1, wherein the isolation structure comprises a field oxide layer.

14. The semiconductor device as claimed in claim 10, wherein the first and the second isolation structures have substantially the same boundary of the channel active region.

15. The semiconductor device as claimed in claim 14, wherein the channel active region protrudes from the first and the second isolation structures.

16. The semiconductor device as claimed in claim 14, wherein the third isolation structure encapsulates sides of the channel active region protruding from the first and the second isolation structures.

* * * * *